United States Patent
Kaneyama

(10) Patent No.: US 7,658,560 B2
(45) Date of Patent: Feb. 9, 2010

(54) SUBSTRATE PROCESSING APPARATUS

(75) Inventor: Koji Kaneyama, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 630 days.

(21) Appl. No.: 11/273,441

(22) Filed: Nov. 10, 2005

(65) Prior Publication Data

US 2006/0098977 A1 May 11, 2006

(30) Foreign Application Priority Data

Nov. 10, 2004 (JP) .............................. 2004-326310

(51) Int. Cl.
*G03D 5/00* (2006.01)
*G03B 27/52* (2006.01)

(52) U.S. Cl. ........................................ 396/611; 355/27
(58) Field of Classification Search ................. 396/611; 118/52, 500, 503, 719; 355/27; 414/935
See application file for complete search history.

(56) References Cited

U.S. PATENT DOCUMENTS

| | | | |
|---|---|---|---|
| 4,985,722 A | 1/1991 | Ushijima et al. | |
| 5,202,716 A | 4/1993 | Tateyama et al. | |
| 5,339,128 A | 8/1994 | Tateyama et al. | |
| 5,442,416 A | 8/1995 | Tateyama et al. | |
| 5,788,868 A | 8/1998 | Itaba et al. | |
| 6,230,721 B1 | 5/2001 | Miyasako | |
| 6,585,430 B2 | 7/2003 | Matsuyama et al. | |
| 6,893,171 B2 | 5/2005 | Fukutomi et al. | |
| 2003/0213431 A1* | 11/2003 | Fukutomi et al. ........... | 118/696 |
| 2004/0182318 A1* | 9/2004 | Hashinoki et al. ........... | 118/719 |

FOREIGN PATENT DOCUMENTS

JP          5-178416          7/1993

(Continued)

OTHER PUBLICATIONS

English Translation of JP 2001-319856 A (dated Nov. 16, 2001).*

(Continued)

*Primary Examiner*—Alan A Mathews
(74) *Attorney, Agent, or Firm*—Ostrolenk Faber LLP

(57) ABSTRACT

An interface transport mechanism uses an upper hand when transporting a substrate from a substrate platform to an exposure device before exposure processing by an exposure device, and uses a lower hand when transporting the substrate from the exposure device to the substrate platform after the exposure processing by the exposure device. That is, the lower hand is used to transport a substrate to which a liquid is attached after exposure processing, and the upper hand is used to transport a substrate to which no liquid is attached before exposure processing.

10 Claims, 6 Drawing Sheets

FOREIGN PATENT DOCUMENTS

| | | |
|---|---|---|
| JP | 9-74126 | 3/1997 |
| JP | 9-74127 | 3/1997 |
| JP | 10-135304 | 5/1998 |
| JP | 10-308430 | 11/1998 |
| JP | 2000-100722 | 4/2000 |
| JP | 2001-319856 | 11/2001 |
| JP | 2003-324139 | 11/2003 |
| JP | 2005-197469 | 7/2005 |
| JP | 2005-294520 | 10/2005 |
| WO | WO/99-49504 | 9/1999 |

OTHER PUBLICATIONS

Office Action in the counterpart Chinese patent application (200510120441.6) issued May 18, 2007 with the English Language Translation.

Notice of Reasons of Refusal issued Sep. 1, 2009 in connection with counterpart Japanese Patent Application No. 2004-326310.

* cited by examiner

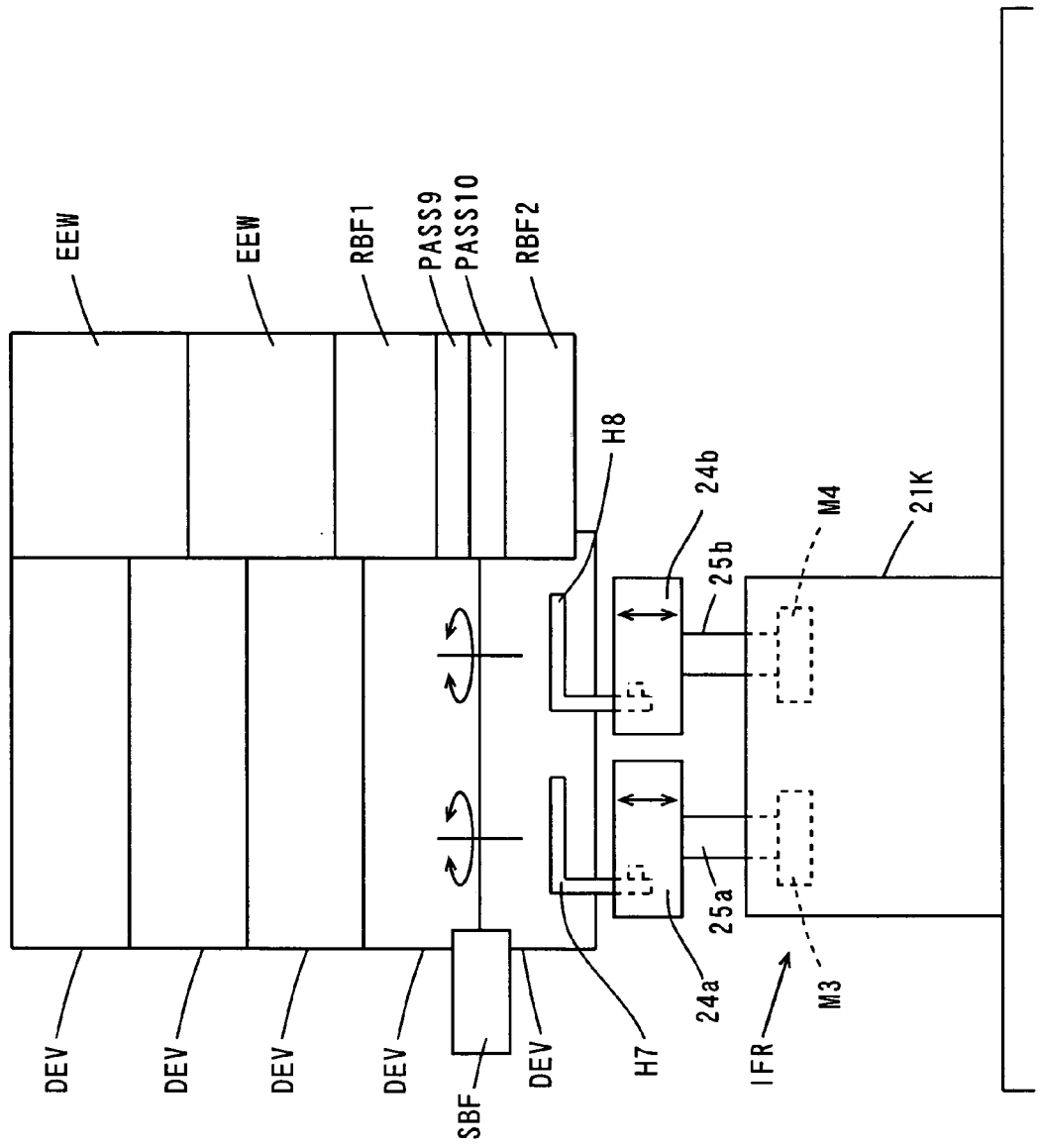
FIG. 6
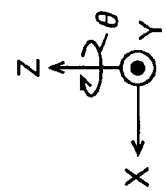

SUBSTRATE PROCESSING APPARATUS

CROSS REFERENCE TO A RELATED APPLICATION

The present application is related to the following four applications filed Nov. 10, 2005: 1) SUBSTRATE PROCESSING APPARATUS AND SUBSTRATE PROCESSING METHOD, U.S. Ser. No. 11/273,463; 2) SUBSTRATE PROCESSING APPARATUS AND SUBSTRATE PROCESSING METHOD, U.S. Ser. No. 11/273,440; 3) SUBSTRATE PROCESSING APPARATUS AND SUBSTRATE PROCESSING METHOD, U.S. Ser. No. 11/273,465, 4) SUBSTRATE PROCESSING APPARATUS AND SUBSTRATE PROCESSING METHOD, U.S. Ser. No. 11/273,439.

BACKGROUND OF THE INVENTION

1. Field of the Invention

The present invention relates to substrate processing apparatuses and substrate processing methods for applying processing to substrates.

2. Description of the Background Art

A substrate processing apparatus is used to apply a variety of processings to substrates such as semiconductor substrates, substrates for use in liquid crystal displays, plasma displays, optical disks, magnetic disks, magneto-optical disks, photomasks, and other substrates.

Such a substrate processing apparatus typically applies a plurality of successive processings to a single substrate. The substrate processing apparatus described in JP 2003-324139 A comprises an indexer block, an anti-reflection film processing block, a resist film processing block, a development processing block, and an interface block. An exposure device is arranged adjacent to the interface block as an external device separate from the substrate processing apparatus.

In the above-described substrate processing apparatus, a substrate is carried from the indexer block into the anti-reflection film processing block and the resist film processing block, where the formation of an anti-reflection film and resist film coating processing are applied to the substrate. The substrate is then carried to the exposure device through the interface block. After exposure processing has been applied to the resist film on the substrate by the exposure device, the substrate is transported to the development processing block through the interface block. In the development processing block, development processing is applied to the resist film on the substrate to form a resist pattern thereon, and the substrate is subsequently carried into the indexer block.

In this substrate processing apparatus, a single holding arm of an interface transport mechanism transports the substrate from the interface block to the exposure device and from the exposure device to the interface block.

With recent improvements in the density and integration of devices, making finer resist patterns have become very important. Conventional exposure devices typically perform exposure processing by providing reduction projection of a reticle pattern on a substrate through a projection lens. With such conventional exposure devices, however, the line width of an exposure pattern is determined by the wavelength of the light source of an exposure device, thus making it impossible to make a resist pattern finer than that.

For this reason, a liquid immersion method is suggested as a projection exposure method allowing for finer exposure patterns (refer to, e.g., WO99/49504 pamphlet). In the projection exposure device according to the WO99/49504 pamphlet, a liquid is filled between a projection optical system and a substrate, resulting in a shorter wavelength of exposure light on a surface of the substrate. This allows for a finer exposure pattern.

However, in the above-described projection exposure device, exposure processing is performed with the substrate and the liquid being in contact with each other. Accordingly, the substrate to which the liquid is attached is transported out of the projection exposure device.

Thus, when combining the substrate processing apparatus according to the aforementioned JP 2003-324139 A with the projection exposure device according to the aforementioned WO99/49504 pamphlet as an external device, the liquid attached to the substrate that is carried out of the projection exposure device settles on the holding arm. Since the holding arm also transports a substrate before exposure processing to the projection exposure device, the liquid settled on the holding arm attaches also to the back surface of the substrate before exposure processing.

Therefore, during the transport of the substrate to the projection exposure device, particles and the like in the atmosphere attach to the liquid on the back surface of the substrate, and contaminate the back surface of the substrate. This may result in degraded resolution performance during the exposure processing due to the contamination of the back surface of the substrate.

SUMMARY OF THE INVENTION

It is an object of the invention to provide a substrate processing apparatus and a substrate processing method in which contamination of back surfaces of substrates can be sufficiently prevented.

(1)

A substrate processing apparatus according to one aspect of the invention that is arranged adjacent to an exposure device comprises a processing section for applying processing to a substrate, and an interface for exchanging the substrate between the processing section and the exposure device, wherein the interface includes a transport device that transports the substrate between the processing section and the exposure device, and the transport device includes a first holder for holding the substrate before exposure processing by the exposure device, and a second holder for holding the substrate after the exposure processing by the exposure device.

In the substrate processing apparatus, the substrate is subjected to the processing in the processing section, and the substrate is transported between the processing section and the exposure device. During the transport of the substrate by the transport device, the substrate is held by the first holder when no liquid due to the exposure processing is attached to the substrate, and the substrate is held by the second holder when a liquid due to the exposure processing is attached to the substrate.

This prevents a liquid from attaching to the first holder, so as to prevent the attachment of a liquid to the back surface of the substrate before the exposure processing. It is thus possible to sufficiently prevent contamination of the back surface of the substrate due to the attachment of particles and the like to the liquid. As a result, it is possible to prevent processing defects due to e.g. degradation in the resolution performance of the exposure device during the exposure processing which may be caused by the contamination of the back surface of the substrate.

(2)

The interface may further include a processing unit that applies given processing to the substrate and a platform on which the substrate is temporarily mounted, and the transport device may include a first transport unit that transports the substrate between the processing section, the processing unit, and the platform, and a second transport unit that transports the substrate between the exposure device and the platform, and wherein the second transport unit may have the first and second holders.

In this case, after the substrate is subjected to the processing in the processing section, the substrate is transported to the processing unit in the interface by the first transport unit in the interface. The substrate is subjected to the given processing by the processing unit, and then transported to the platform in the interface by the first transport unit. After this, the substrate is transported to the exposure device by the second transport unit in the interface. The substrate is subjected to the exposure processing by the exposure device, and subsequently transported to the platform by the second transport unit.

When transporting the substrate from the platform to the exposure device, the second transport unit holds the substrate before the exposure processing by the exposure device with the first holder. When transporting the substrate from the exposure device to the platform, the second transport unit holds the substrate after the exposure processing by the exposure device with the second holder.

This prevents a liquid from attaching to the first holder, so as to prevent the attachment of a liquid to the back surface of the substrate before the exposure processing. It is thus possible to sufficiently prevent contamination of the back surface of the substrate due to the attachment of particles and the like to the liquid. As a result, it is possible to prevent processing defects due to e.g. degradation in the resolution performance of the exposure device during the exposure processing which may be caused by the contamination of the back surface of the substrate.

(3)

The first transport unit may have a third holder for holding the substrate before the exposure processing by the exposure device and a fourth holder for holding the substrate after the exposure processing by the exposure device.

In this case, the first transport unit holds the substrate before the exposure processing by the exposure device with the third holder, and holds the substrate after the exposure processing by the exposure device with the fourth holder.

This prevents a liquid from attaching to the third holder, so as to prevent the attachment of a liquid to the back surface of the substrate before the exposure processing. It is thus possible to sufficiently prevent contamination of the back surface of the substrate due to the attachment of particles and the like to the liquid. As a result, it is possible to prevent processing defects due to e.g. degradation in the resolution performance of the exposure device during the exposure processing which may be caused by the contamination of the back surface of the substrate.

(4)

The platform may include a first platform unit on which the substrate before the exposure processing by the exposure device is mounted, and a second platform unit on which the substrate after the exposure processing by the exposure device is mounted.

In this case, the substrate is mounted on the first platform unit before the exposure processing by the exposure device, and mounted on the second platform unit after the exposure processing by the exposure device.

This prevents a liquid from attaching to the first platform unit, so as to prevent the attachment of a liquid to the back surface of the substrate before the exposure processing. It is thus possible to prevent contamination of the back surface of the substrate due to the attachment of particles and the like to the liquid more sufficiently. As a result, it is possible to prevent processing defects due to e.g. degradation in the resolution performance of the exposure device during the exposure processing which may be caused by the contamination of the back surface of the substrate.

(5)

The processing unit may include an edge exposure unit that subjects a peripheral portion of the substrate to exposure. In this case, the peripheral portion of the substrate is subjected to exposure by the edge exposure unit.

(6)

The processing unit may include a thermal processing unit that subjects the substrate to given thermal treatment. In this case, the substrate is subjected to the given thermal treatment by the thermal processing unit.

(7)

The processing unit may include a photosensitive film formation unit that forms a photosensitive film made of a photosensitive material on the substrate. In this case, the photosensitive film of a photosensitive material can be formed on the substrate by the photosensitive film formation unit before the exposure processing.

(8)

The processing unit may further include an anti-reflection film formation unit that forms an anti-reflection film on the substrate before the formation of the photosensitive film by the photosensitive film formation unit. In this case, the formation of the anti-reflection film on the substrate allows reductions in a standing wave and halation that may be generated during the exposure processing.

(9)

The processing unit may include a development processing unit that subjects the substrate to development processing. In this case, the substrate is subjected to the development processing.

(10)

The first and second holders may be provided one above the other, and the second holder may be provided below the first holder. In this case, the second holder is provided below the first holder, which prevents a liquid that may drop from the second holder and the substrate held thereon from attaching to the first holder and the substrate held thereon.

This prevents a liquid from attaching to the substrate before the exposure processing, so as to prevent contamination of the substrate due to the attachment of particles and the like to the liquid more sufficiently. Accordingly, it is possible to prevent processing defects due to e.g. degradation in the resolution performance of the exposure device during the exposure processing which may be caused by the contamination of the back surface of the substrate.

(11)

The first and second holders may be aligned in a substantially horizontal direction. In this case, the second holder and the first holder are aligned in a substantially horizontal direction, which prevents a liquid that may drop from the second holder and the substrate held thereon from attaching to the first holder and the substrate held thereon.

This prevents a liquid from attaching to the substrate before the exposure processing, so as to prevent contamination of the substrate due to the attachment of particles and the like to the liquid more sufficiently. Accordingly, it is possible to prevent processing defects due to e.g. degradation in the resolution performance of the exposure device.

Moreover, the alignment of the first and second holders in a substantially horizontal direction allows the transport device to concurrently transfer substrates with the first and second holders. This results in a reduced time for processing substrates, and therefore improved throughput.

(12)

A substrate processing method according to still another aspect of the invention in which a substrate is processed in a substrate processing apparatus that is arranged adjacent to an exposure device and comprises a processing section and a transport device, comprises the steps of applying processing to the substrate in the processing section, transporting the substrate that has been processed in the processing section to the exposure device while holding the substrate by the first holder of the transport device, and transporting the substrate that has been subjected to exposure processing by the exposure device to the processing section while holding the substrate by the second holder of the transport device.

In the substrate processing method, the substrate is subjected to the processing by the processing unit, and the substrate processed in the processing section is held by the first holder and transported to the exposure device. After this, the substrate subjected to the exposure processing by the exposure device is held by the second holder and transported to the processing section.

This prevents a liquid from attaching to the first holder, so as to prevent the attachment of a liquid to the back surface of the substrate before the exposure processing. It is thus possible to sufficiently prevent contamination of the back surface of the substrate due to the attachment of particles and the like to the liquid. As a result, it is possible to prevent processing defects due to e.g. degradation in the resolution performance of the exposure device during the exposure processing which may be caused by the contamination of the back surface of the substrate.

According to the invention, it is possible to sufficiently prevent contamination of substrates before exposure processing.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a diagram for use in illustrating the configuration and the operation of the interface transport mechanism in FIG. 5.

DESCRIPTION OF THE PREFERRED EMBODIMENTS

A substrate processing apparatus according to embodiments of the invention will be described below with reference to the drawings. A substrate as used in the specification includes a semiconductor substrate, a substrate for a liquid crystal display, a substrate for a plasma display, a glass substrate for a photomask, a substrate for an optical disk, a substrate for a magnetic disk, a substrate for a magneto-optical disk, and a substrate for a photomask.

First Embodiment

Figure 1:
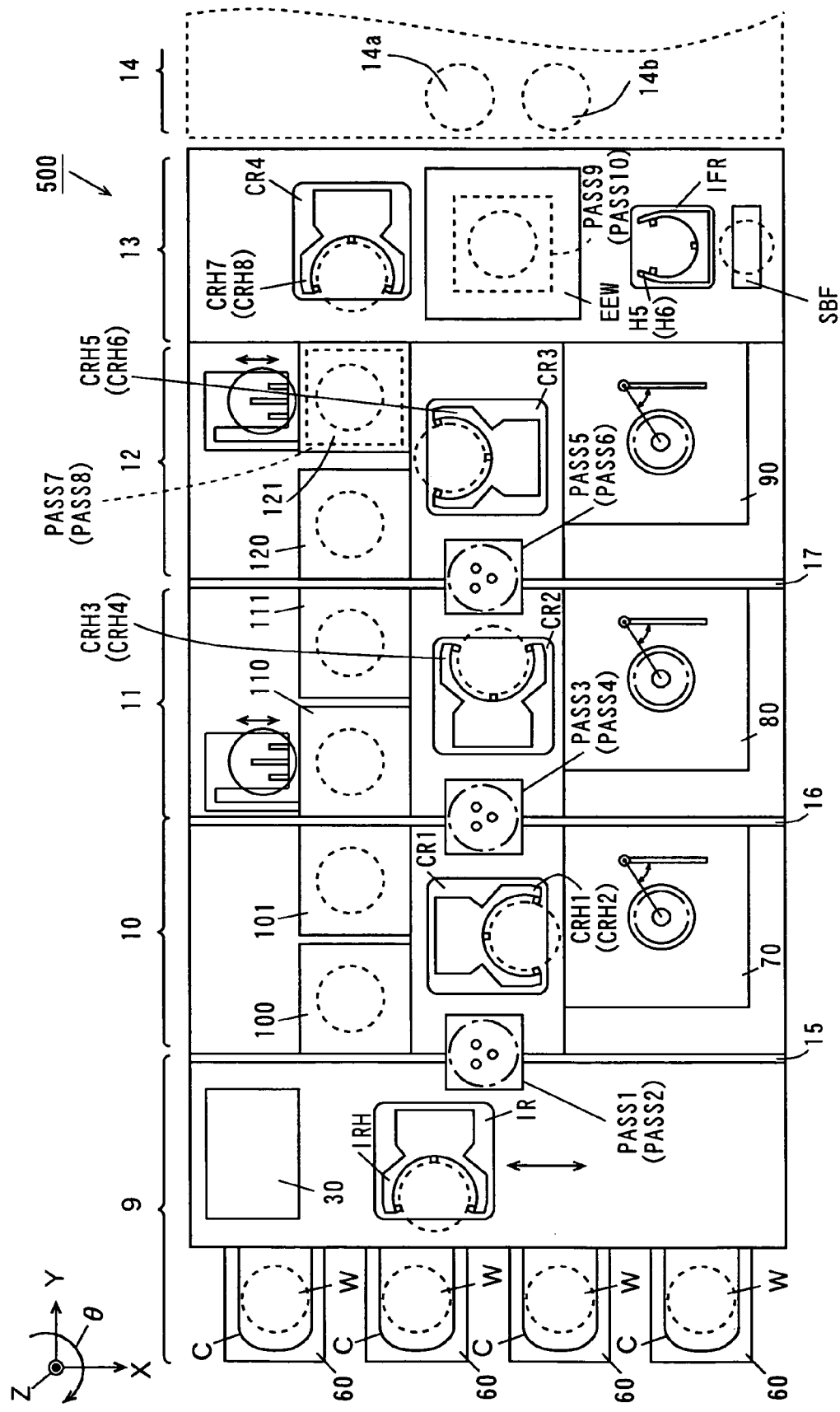
FIG. 1 is a plan view of a substrate processing apparatus according to a first embodiment.

A substrate processing apparatus according to a first embodiment of the invention is described. FIG. 1 is a plan view of the substrate processing apparatus according to the first embodiment.

FIG. 1 and each of the subsequent drawings is accompanied by the arrows that indicate X, Y, and Z directions perpendicular to one another for clarification of positions. The X and Y directions are perpendicular to each other in a horizontal plane, and the Z direction corresponds to the vertical direction. In each of the directions, the direction toward an arrow is defined as + direction, and the opposite direction is defined as − direction. The rotation direction about the Z direction is defined as θ direction.

As shown in FIG. 1, the substrate processing apparatus 500 includes an indexer block 9, an anti-reflection film processing block 10, a resist film processing block 11, a development processing block 12, and an interface block 13. An exposure device 14 is arranged adjacent to the interface block 13. The exposure device 14 applies exposure processing to substrates W by a liquid immersion method. In this embodiment, therefore, a liquid is attached to the substrates W after the exposure processing by the exposure device 14.

Each of the indexer block 9, the anti-reflection film processing block 10, the resist film processing block 11, the development processing block 12, and the interface block 13 will hereinafter be referred to as a processing block.

The indexer block 9 includes a main controller (controller) 30 for controlling the operation of each processing block, a plurality of carrier platforms 60, and an indexer robot IR. The indexer robot IR has a hand IRH for receiving and transferring the substrates W.

The anti-reflection film processing block 10 includes thermal processing groups 100, 101 for anti-reflection film, a coating processing group 70 for anti-reflection film, and a first central robot CR1. The coating processing group 70 is arranged opposite to the thermal processing groups 100, 101 with the first central robot CR1 therebetween. The first central robot CR1 has hands CRH1, CRH2 provided one above the other for receiving and transferring the substrates W.

A partition wall 15 is arranged between the indexer block 9 and the anti-reflection film processing block 10 for shielding an atmosphere. The partition wall 15 has substrate platforms PASS1, PASS2 provided closely one above the other for receiving and transferring the substrates W between the indexer block 9 and the anti-reflection film processing block 10. The upper substrate platform PASS1 is used in transferring the substrates W from the indexer block 9 to the anti-reflection film processing block 10, and the lower substrate platform PASS2 is used in transferring the substrates W from the anti-reflection film processing block 10 to the indexer block 9.

Each of the substrate platforms PASS1, PASS2 has an optical sensor (not shown) for detecting the presence or absence of a substrate W. This enables a determination to be made whether or not a substrate W is on the substrate platform PASS1, PASS2. In addition, each of the substrate platforms PASS1, PASS2 has a plurality of support pins secured thereto.

Note that each of substrate platforms PASS3 to PASS10 mentioned below similarly has such optical sensor and support pins.

The resist film processing block 11 includes thermal processing groups 110, 111 for resist film, a coating processing group 80 for resist film, and a second central robot CR2. The coating processing group 80 is arranged opposite to the thermal processing groups 110, 111 with the second central robot CR2 therebetween. The second central robot CR2 has hands CRH3, CRH4 provided one above the other for receiving and transferring the substrates W.

A partition wall 16 is arranged between the anti-reflection film processing block 10 and the resist film processing block 11 for shielding an atmosphere. The partition wall 16 has substrate platforms PASS3, PASS4 provided closely one above the other for receiving and transferring the substrates W between the anti-reflection film processing block 10 and the resist film processing block 11. The upper substrate platform PASS3 is used in transferring the substrates W from the anti-reflection film processing block 10 to the resist film processing resist film processing block 11, and the lower substrate platform PASS4 is used in transferring the substrates W from the resist film processing block 11 to the anti-reflection film processing block 10.

The development processing block 12 includes thermal processing groups 120, 121 for development, a development processing group 90, and a third central robot CR3. The thermal processing group 121, adjacent to the interface block 13, comprises the substrate platforms PASS7, PASS8 as described below. The development processing group 90 is arranged opposite to the thermal processing groups 120, 121 with the third central robot CR3 therebetween. The third central robot CR3 has hands CRH5, CRH6 provided one above the other for receiving and transferring the substrates W.

A partition wall 17 is arranged between the resist film processing block 11 and the development processing block 12 for shielding an atmosphere. The partition wall 17 has substrate platforms PASS5, PASS6 provided closely one above the other for receiving and transferring the substrates W between the resist film processing block 11 and the development processing block 12. The upper substrate platform PASS5 is used in transferring the substrates W from the resist film processing block 11 to the development processing block 12, and the lower substrate platform PASS6 is used in transferring the substrates W from the development processing block 12 to the resist film processing block 11.

The interface block 13 includes a fourth central robot CR4, a buffer SBF, an interface transport mechanism IFR, and edge exposure units EEW. Return buffer units RBF1, RBF2 and substrate platforms PASS9, PASS10 mentioned below are provided below the edge exposure units EEW. The fourth central robot CR4 has hands CRH7, CRH8 provided one above the other for receiving and transferring the substrates W.

The interface transport mechanism IFR has a hand H5 and a hand H6 for receiving and transferring the substrates W. In this embodiment, the hand H5 and the hand H6 are provided one above the other. Note that the hand H5 is positioned above the hand H6 (see FIG. 2 and FIG. 4 below).

The interface transport mechanism IFR exchanges the substrates W between the substrate platform PASS9 and the exposure device 14, and between the exposure device 14 and the substrate platform PASS10. The interface transport mechanism IFR will be described in detail below.

In the substrate processing apparatus 500 according to this embodiment, the indexer block 9, the anti-reflection film processing block 10, the resist film processing block 11, the development processing block 12, and the interface block 13 are sequentially arranged in parallel along the Y direction.

Figure 2:
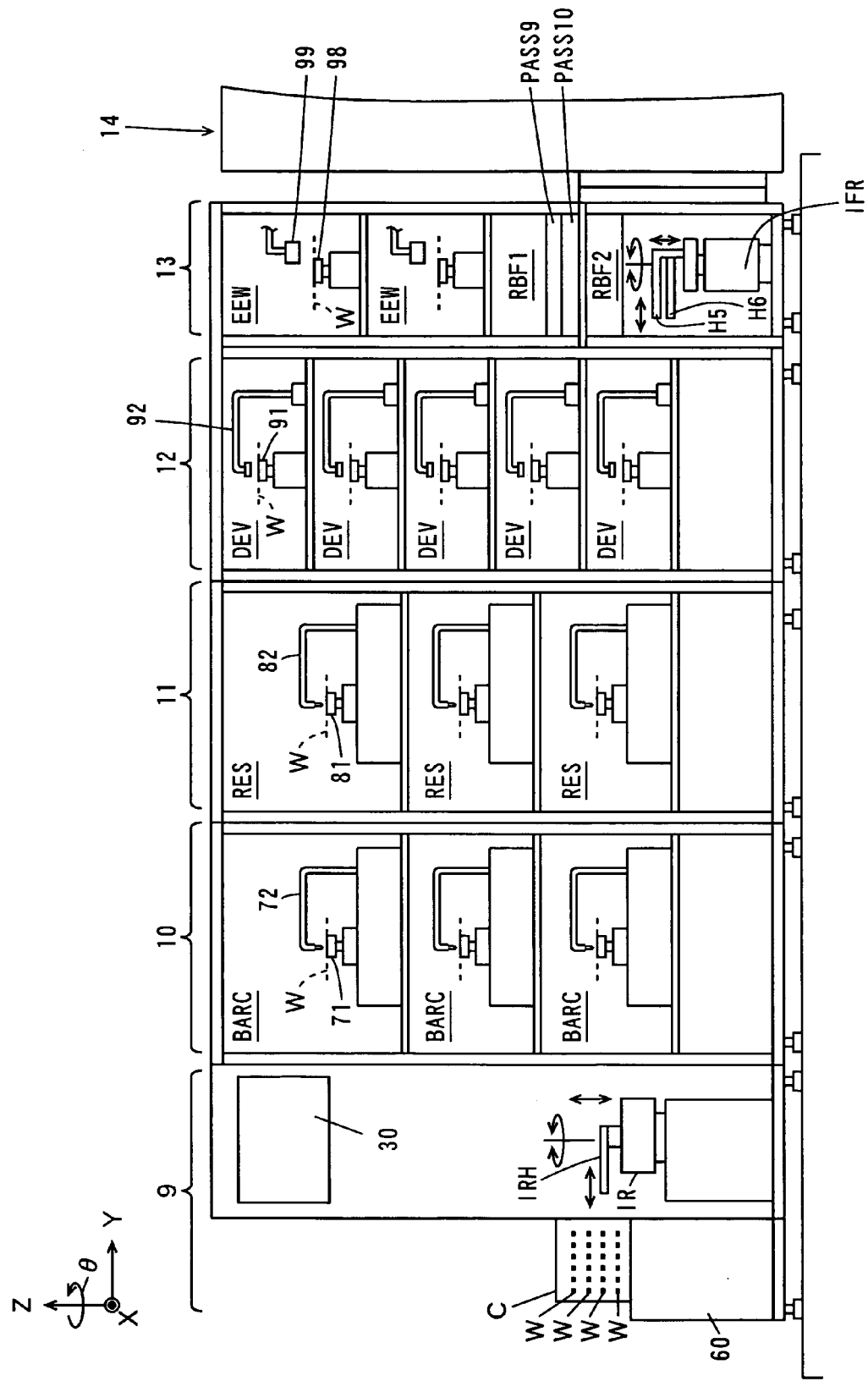
FIG. 2 is a side view of the substrate processing apparatus in FIG. 1 that is seen from the +X direction.

FIG. 2 is a side view of the substrate processing apparatus 500 in FIG. 1 that is seen from the +X direction.

The coating processing group 70 in the anti-reflection film processing block 10 (see FIG. 1) includes a vertical stack of three coating units BARC. Each of the coating units BARC comprises a spin chuck 71 for rotating a substrate W while holding the substrate W in a horizontal attitude by suction, and a supply nozzle 72 for supplying coating liquid for anti-reflection film to the substrate W held on the spin chuck 71.

The coating processing group 80 in the resist film processing block 11 (see FIG. 1) includes a vertical stack of three coating units RES. Each of the coating units RES comprises a spin chuck 81 for rotating a substrate W while holding the substrate W in a horizontal attitude by suction, and a supply nozzle 82 for supplying coating liquid for resist film to the substrate W held on the spin chuck 81.

The development processing group 90 in the development processing block 12 includes a vertical stack of five development processing units DEV. Each of the development processing units DEV comprises a spin chuck 91 for rotating a substrate W while holding the substrate W in a horizontal attitude by suction, and a supply nozzle 92 for supplying development liquid to the substrate W held on the spin chuck 91.

The interface block 13 includes a vertical stack of the two edge exposure units EEW, return buffer unit RBF1, substrate platforms PASS9, PASS10, and return buffer unit RBF2, and also includes the fourth central robot CR4 (see FIG. 1) and interface transport mechanism IFR. Each of the edge exposure units EEW comprises a spin chuck 98 for rotating a substrate W while holding the substrate W in a horizontal attitude by suction, and a light irradiator 99 for subjecting a peripheral edge of the substrate W held on the spin chuck 98 to exposure.

Figure 3:
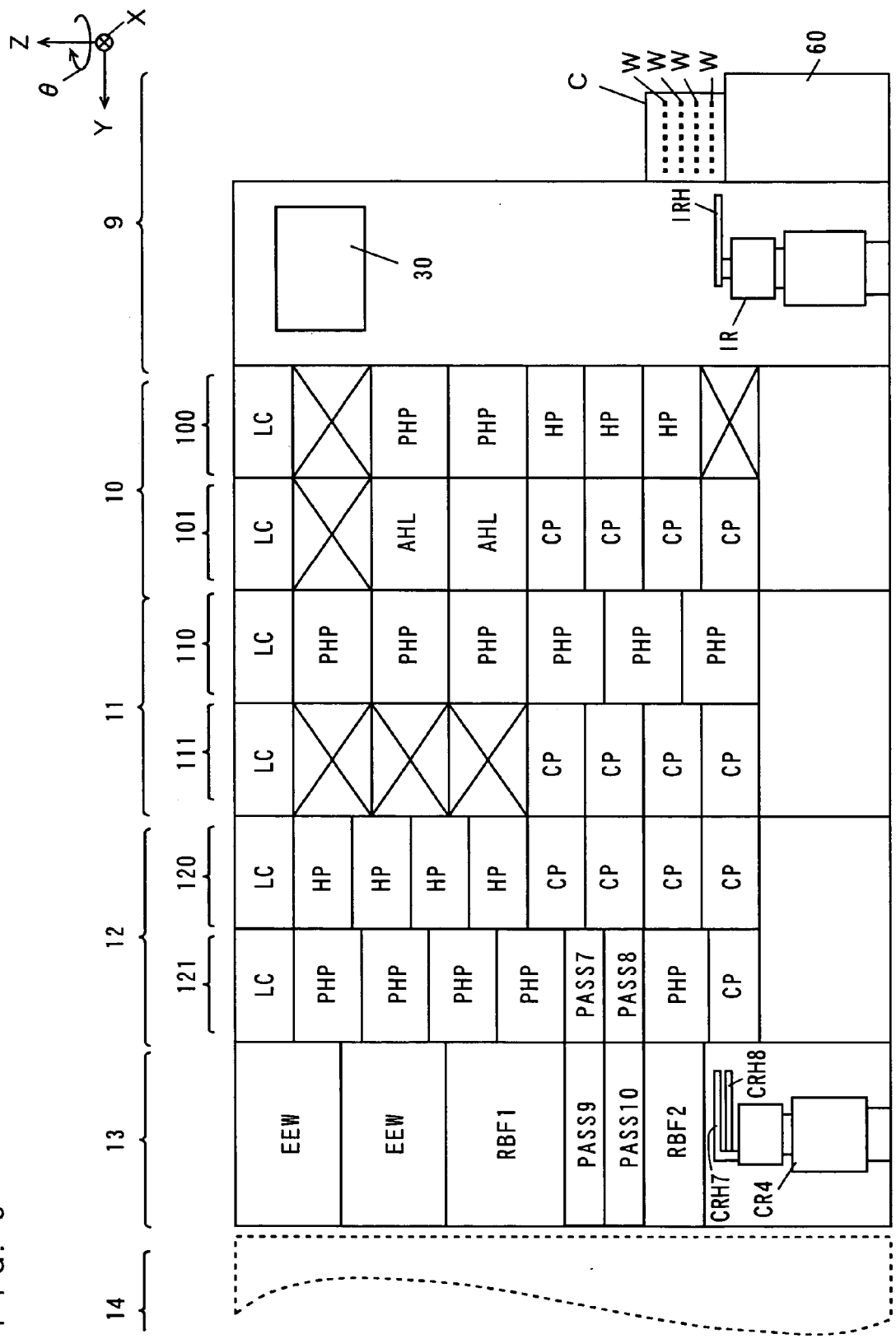
FIG. 3 is a side view of the substrate processing apparatus in FIG. 1 that is seen from the −X direction.

FIG. 3 is a side view of the substrate processing apparatus 500 in FIG. 1 that is seen from the −X direction.

In the anti-reflection film processing block 10, the thermal processing group 100 includes a vertical stack of two thermal processing units PHP each having an interface unit (hereinafter simply referred to as thermal processing units) and three hot plates HP, and the thermal processing group 101 includes a vertical stack of two adhesion agent coating processing units AHL and four cooling plates CP. The thermal processing group 100 also includes a local controller LC on top thereof for controlling the temperatures of the thermal processing units PHP and the hot plates HP, and the thermal processing group 101 also includes a local controller LC on top thereof for controlling the temperatures of the adhesion agent coating processing units AHL and the cooling plates CP.

In the resist film processing block 11, the thermal processing group 110 includes a vertical stack of six thermal processing units PHP, and the thermal processing group 111 includes a vertical stack off our cooling plates CP. The thermal processing group 110 also includes a local controller LC on top thereof for controlling the temperatures of the thermal processing units PHP, and the thermal processing group 111 also includes a local controller LC on top thereof for controlling the temperatures of the cooling plates CP.

In the development processing block 12, the thermal processing group 120 includes a vertical stack of four hot plates HP and four cooling plates CP, and the thermal processing group 121 includes a vertical stack of five thermal processing units PHP, substrate platforms PASS7, PASS8, and a cooing plate CP. The thermal processing group 120 also includes a local controller LC on top thereof for controlling the temperatures of the hot plates HP and the cooling plates CP, and the thermal processing group 121 also includes a local controller LC for controlling the temperatures of the thermal processing units PHP and the cooling plate CP.

The operation of the substrate processing apparatus 500 in this embodiment is described.

Carriers C for storing the substrates W in multiple stages are mounted on the carrier platforms 60, respectively, in the indexer block 9. The indexer robot IR takes out a substrate W yet to be processed which is stored in a carrier C using the hand IRH. Then, the indexer robot IR moves in the ±X direction while rotating in the ±θ direction to transfer the unprocessed substrate W onto the substrate platform PASS1.

Although FOUPs (Front Opening Unified Pods) are adopted as the carriers C in this embodiment, SMIF (Standard Mechanical Inter Face) pods or OCs (Open Cassettes) that expose stored substrates W to outside air may also be used, for example. In addition, although linear-type transport robots that move their hands forward or backward by sliding them linearly to a substrate W are used as the indexer robot IR, the first central robot CR1 to the fourth central robot CR4, and the interface transport mechanism IFR, multi-joint type transport robots that linearly move their hands forward and backward by moving their joints may also be used.

The unprocessed substrate W that has been transferred onto the substrate platform PASS1 is received by the hand CRH1 of the first central robot CR1 in the anti-reflection film processing block 10. The first central robot CR1 carries the substrate W to the thermal processing group 100 or 101 with the hand CRH1. After this, the first central robot CR1 takes out the thermally treated substrate W from the thermal processing group 100 or 101 with the hand CRH2, and then carries the substrate W to the coating processing group 70. The coating processing group 70 forms a coating of an anti-reflection film over a lower portion of a photoresist film using a coating unit BARC, in order to reduce a standing wave and halation that may be generated during exposure.

The first central robot CR1 subsequently takes out the substrate W after the coating processing from the coating processing group 70 with the hand CRH1, and carries the substrate W to the thermal processing group 100 or 101.

Then, the first central robot CR1 takes out the thermally treated substrate W from the thermal processing group 100 or 101 with the hand CRH2, and transfers the substrate W onto the substrate platform PASS3.

The substrate W on the substrate plat form PASS3 is received by the hand CRH3 of the second central robot CR2 in the resist film processing block 11. The second central robot CR2 carries the substrate W to the thermal processing group 110 or 111 with the hand CRH3. The second central robot CR2 then takes out the thermally treated substrate W from the thermal processing group 110 or 111 with the hand CRH4, and transfers the substrate W to the coating processing group 80. In the coating processing group 80, a photoresist film is applied on the substrate W having the anti-reflection film thereon by a coating unit RES.

After this, the second central robot CR2 takes out the substrate W after the coating processing from the coating processing group 80 with the hand CRH3, and carries the substrate to the thermal processing group 110 or 111.

Then, the second central robot CR2 takes out the thermally treated substrate W from the thermal processing group 110 or 111 with the hand CRH4, and transfers the substrate W onto the substrate platform PASS5.

The substrate W on the substrate platform PASS5 is received by the hand CRH5 of the third central robot CR3 in the development processing block 12. The third central robot CR3 transfers the substrate W onto the substrate platform PASS7 with the hand CRH5. The substrate W on the substrate platform PASS7 is received by the hand CRH7 of the fourth central robot CR4 in the interface block 13. The fourth central robot CR4 transfers the substrate W to an edge exposure unit EEW with the hand CRH7. The peripheral portion of the substrate W is subjected to exposure processing by the edge exposure unit EEW.

Then, the fourth central robot CR4 takes out the substrate W after the edge exposure processing from the edge exposure unit EEW with the hand CRH7, and subsequently transfers the substrate W onto the substrate platform PASS9 with the hand CHR7.

The substrate on the substrate platform PASS9 is carried into the exposure device 14 by the interface transport mechanism IFR. When transporting the substrate W to the exposure device 14, the interface transport mechanism IFR holds the substrate W with the upper hand H5.

After the substrate W is subjected to exposure processing by the exposure device 14, the interface transport mechanism IFR receives the substrate W from the exposure device 14, and transfers the received substrate W onto the substrate platform PASS10. When transporting the substrate W onto the PASS10, the interface transport mechanism IFR holds the substrate W with the lower hand H6. The interface transport mechanism IFR will be described in detail below.

The substrate W on the substrate platform PASS10 is received by the lower hand CRH8 of the fourth central robot CR4 in the interface block 13. The fourth central robot CR4 carries the substrate W into the thermal processing group 121 in the development processing block 12 with the hand CRH8. The substrate W is thermally treated by the thermal processing group 121. After this, the fourth central robot CR4 takes out the substrate W from the thermal processing group 121 with the hand CRH8, and transfers the substrate W onto the substrate platform PASS8.

The substrate W on the substrate platform PASS8 is received by the hand CRH6 of the third central robot CR3 in the development processing block 12. The third central robot CR3 carries the substrate W into the development processing group 90 with the hand CRH6. The exposed substrate W is subjected to development processing by the development processing group 90.

After this, the third central robot CR3 takes out the substrate W after the development processing from the development processing group 90 with the hand CRH5, and carries the substrate W into the thermal processing group 120.

Next, the third central robot CR3 takes out the thermally treated substrate W from the thermal processing group 120 with the hand CRH6, and transfers the substrate W onto the substrate platform PASS6 provided in the resist film processing block 11.

If the development processing group 90 is temporarily not capable of applying development processing to the substrate W by, e.g., a failure, the substrate W may temporarily be stored in the return buffer RBF1 in the interface block 13 after the thermal treatment in the thermal processing group 121.

The substrate W on the substrate platform PASS6 is transferred onto the substrate platform PASS4 by the hand CRH4 of the second central robot CR2 in the resist film processing block 11. The substrate W on the substrate platform PASS4 is transferred onto the substrate platform PASS2 by the hand CRH2 of the first central robot CR1 in the anti-reflection film processing block 10.

The substrate W on the substrate platform PASS2 is stored in a carrier C by the indexer robot IR in the indexer block 9.

Each of the processings to the substrate W in the substrate processing apparatus 500 is thus completed.

Figure 4:
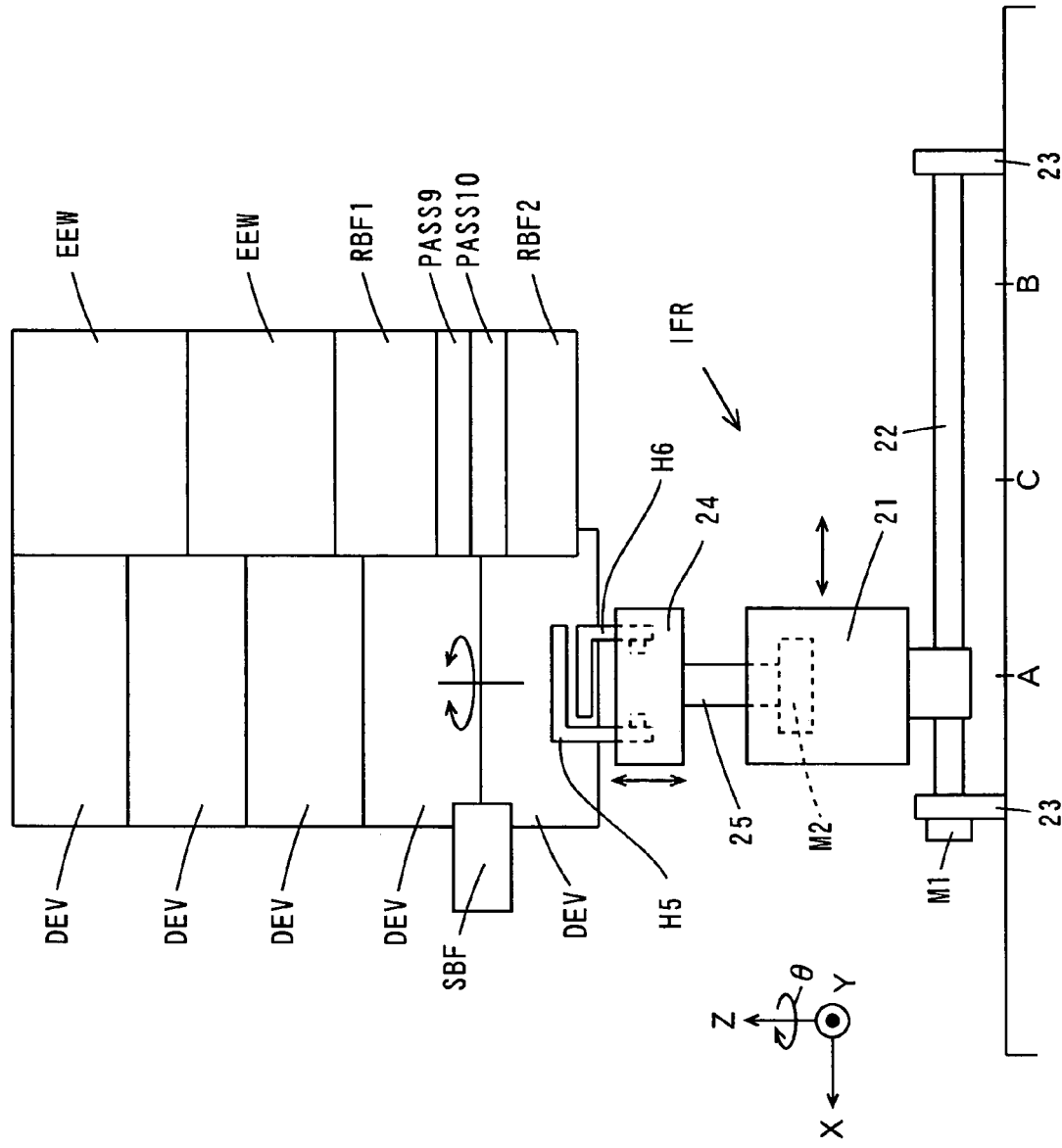
FIG. 4 is a diagram for use in illustrating the configuration and the operation of the interface transport mechanism in FIG. 1.

The interface transport mechanism IFR is described. FIG. 4 is a diagram for use in illustrating the configuration and the operation of the interface transport mechanism IFR in FIG. 1.

The configuration of the interface transport mechanism IFR in FIG. 1 is described. As shown in FIG. 4, a movable base 21 of the interface transport mechanism IFR is threadably mounted to a screwed shaft 22. The screwed shaft 22 is rotatively supported with support bases 23 so as to extend in the X direction. One end of the screwed shaft 22 is provided with a motor M1, which causes the screwed shaft 22 to rotate and the movable base 21 to horizontally move in the ±X direction.

A hand support base 24 is mounted on the movable base 21 so as to rotate in the ±θ direction while moving up and down in the ±Z direction. The hand support base 24 is coupled to a motor M2 in the movable base 21 through a rotation shaft 25, and rotated by the motor M2. Two hands H5, H6 for holding the substrate W in a horizontal attitude are mounted to the hand support base 24 one above the other so as to move forward and backward.

The operation of the interface transport mechanism IFR in FIG. 1 is next described. The operation of the interface transport mechanism IFR is controlled by the main controller 30 in FIG. 1.

The interface transport mechanism IFR initially rotates the hand support base 24 at the position A in FIG. 4 while lifting the hand support base 24 in the +Z direction, to allow the upper hand H5 to enter the substrate platform PASS9. When the hand H5 has received the substrate W at the substrate platform PASS9 before exposure processing by the exposure device 14, the interface transport mechanism IFR retracts the hand H5 from the substrate platform PASS9, and lowers the hand support base 24 in the −Z direction.

At the time, the interface transport mechanism IFR moves in the −X direction, and rotates the hand support base 24 at the position B in FIG. 4 while allowing the hand H5 holding the substrate W to enter a substrate inlet 14a (see FIG. 1) of the exposure device 14. After carrying the substrate W into the substrate inlet 14a, the interface transport mechanism IFR retracts the hand H5 from the substrate inlet 14a. The transfer of the substrate W from the substrate platform PASS9 to the exposure device 14 is thus completed.

Then, the interface transport mechanism IFR moves in the +X direction, and allows the lower hand H6 to enter a substrate outlet 14b (see FIG. 1) of the exposure device 14 at the position C in FIG. 4. When the hand H6 has received the substrate W at the substrate outlet 14b after exposure processing by the exposure device 14, the interface transport mechanism IFR retracts the hand H6 from the substrate outlet 14b.

After this, the interface transport mechanism IFR moves in the +X direction, and rotates the hand support base 24 at the position A while lifting the hand support base 24 in the +Z direction, to allow the hand H6 holding the substrate W to enter the substrate platform PASS10. The substrate W is thus transferred onto the substrate platform PASS10. The transfer of the substrate W from the exposure device 14 to the substrate platform PASS10 is thus completed.

During the transfer of the substrate W from the exposure device 14 to the substrate platform PASS10, the substrate W may temporarily be stored in the return buffer RBF2 when the substrate platform PASS10 is not capable of receiving the substrate W.

Also, during the transport of the substrate W from the substrate platform PASS9 to the exposure device 14, the substrate W may temporarily be stored in the buffer SBF when the exposure device 14 is not capable of receiving the substrate W.

As described above, in this embodiment, the interface transport mechanism IFR uses the upper hand H5 when transporting the substrate W from the substrate platform PASS9 to the exposure device 14 before the exposure processing by the exposure device 14.

On the other hand, the interface transport mechanism IFR uses the lower hand H6 when transporting the substrate W from the exposure device 14 to the substrate platform PASS10 after the exposure processing by the exposure device 14.

That is, when transporting a substrate W to which a liquid due to the exposure processing is attached, the hand H6 holds the substrate W. When transporting a substrate W to which no liquid due to the exposure processing is attached, the hand H5 holds the substrate W. No liquid therefore attaches to the hand H5 from the substrate W.

This prevents the attachment of a liquid to the back surface of the substrate W before the exposure processing, so as to sufficiently prevent the contamination of the back surface of the substrate W due to the attachment of particles and the like to the liquid. It is thus possible to prevent processing defects due to e.g. degradation in the resolution performance of the exposure device 14.

Moreover, in this embodiment, when transporting the substrate W from the substrate platform PASS7 to an edge exposure unit EEW and from the edge exposure unit EEW to the substrate platform PASS9, the fourth central robot CR4 holds the substrate W with the upper hand CRH7. On the other hand, when transporting the substrate W from the substrate platform PASS10 to the thermal processing group 121, the fourth central robot CR4 holds the substrate W with the lower hand CRH8.

In addition, the substrate W is transferred onto the substrate platform PASS9 before the exposure processing by the exposure device 14, and transferred onto the substrate platform PASS10 after the exposure processing by the exposure device 14.

This further prevents the attachment of a liquid to the back surface of the substrate W before the exposure processing, so as to prevent the contamination of the back surface of the substrate W due to the attachment of particles and the like to the liquid more sufficiently. It is thus possible to further prevent processing defects due to e.g. degradation in the resolution performance of the exposure device 14.

In this embodiment, the hand H6 is arranged below the hand H5, and therefore a liquid that may drop from the hand H6 and a substrate W held thereon does not attach to the hand H5 and a substrate W held thereon.

This prevents the attachment of a liquid to the substrate W before the exposure processing, so as to prevent the contamination of the substrate W due to the attachment of particles and the like to the liquid more sufficiently. It is thus possible to prevent processing defects due to e.g. degradation in the resolution performance of the exposure device 14.

In this embodiment, the single interface transport mechanism IFR is used to transport the substrate W from the substrate platform PASS9 to the exposure device 14 and from the exposure device 14 to the substrate platform PASS10; however, a plurality of interface transport mechanisms IFR may also be used to transport the substrate W. In this case, each of the plurality of interface transport mechanisms IFR has a hand for holding a substrate W before exposure processing by the exposure device 14 and a hand for holding a substrate W after exposure processing by the exposure device 14.

Although the configuration of the hands for exchanging the substrates W is not described in this embodiment, such hands may be configured to support a peripheral portion of a substrate W or may be configured to hold the back surface of a substrate W by suction.

Second Embodiment

Figure 5:
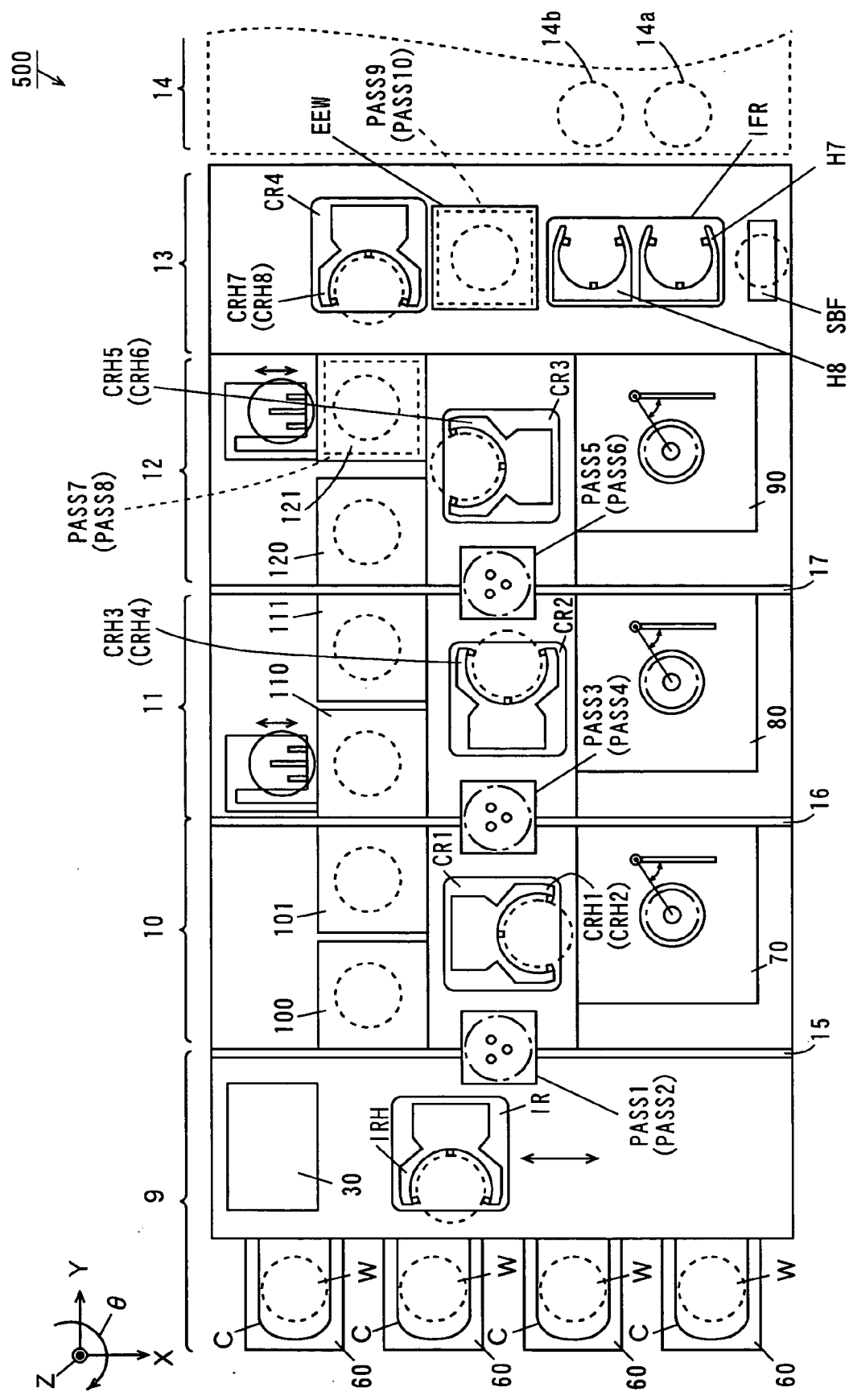
FIG. 5 is a plan view showing a substrate processing apparatus according to a second embodiment.

The substrate processing apparatus according to the second embodiment is described. FIG. 5 is a plan view showing the semiconductor laser apparatus according to the second embodiment.

The substrate processing apparatus 500 in the second embodiment differs from the substrate processing apparatus 500 in the first embodiment as follows.

As shown in FIG. 5, a substrate inlet 14a and a substrate outlet 14b of an exposure device 14 are arranged in different positions from those of the substrate inlet 14a and the substrate outlet 14b of the exposure device 14 in FIG. 1. In FIG. 5, the substrate outlet 14b is arranged in the −X direction relative to the substrate inlet 14a.

An interface transport mechanism IFR in an interface block 13 is configured to extend in the X direction, and has two hands H7 and H8 that are aligned in the X direction.

The interface transport mechanism IFR in FIG. 5 is described. FIG. 6 is a diagram for use in illustrating the configuration and the operation of the interface transport mechanism IFR in FIG. 5.

The configuration of the interface transport mechanism IFR in FIG. 5 is described. As shown in FIG. 6, hand support bases 24a, 24b are mounted in the interface transport mechanism IFR so as to align in the X direction on a securing base 21K that is configured to extend in the X direction. Each of the hand support bases 24a, 24b is mounted so as to rotate in the ±θ direction while moving up and down in the ±Z direction.

The hand support bases 24a, 24b are coupled to motors M3, M4, respectively, in the securing base 21K, through rotation shafts 25a, 25b. The hand support bases 24a, 24b are rotated by these motors M3, M4, respectively.

A hand H7 for holding a substrate W in a horizontal attitude is attached to the hand support base 24a so as to move forward and backward. A hand H8 for holding a substrate W in a horizontal attitude is attached to the hand support base 24b so as to move forward and backward.

The operation of the interface transport mechanism IFR in FIG. 5 is next described. The operation of the interface transport mechanism IFR is controlled by the main controller 30 in FIG. 5.

The interface transport mechanism IFR rotates the hand support base 24a while lifting the hand support base 24a in the +Z direction to allow the hand H7 to enter the substrate platform PASS9. When the hand H7 has received a substrate W at the substrate platform PASS9 before exposure processing by the exposure device 14, the interface transport mechanism IFR retracts the hand H7 from the substrate platform PASS9, and lowers the hand support base 24 in the −Z direction.

At the time, the interface transport mechanism IFR rotates the hand support base 24a while allowing the hand H7 holding the substrate W to enter the substrate inlet 14a (see FIG. 5) of the exposure device 14. After carrying the substrate W into the substrate inlet 14a, the interface transport mechanism IFR retracts the hand H7 from the substrate inlet 14a. The transport of the substrate W to the exposure device 14 from the substrate platform PASS9 is thus completed.

After or concurrently with the above-described operation, the interface transport mechanism IFR allows the hand H8 to enter the substrate outlet 14b (see FIG. 5) of the exposure device 14. When the hand H8 has received a substrate W at the substrate outlet 14b after exposure processing by the exposure device 14, the interface transport mechanism IFR retracts the hand H8 from the substrate outlet 14b.

At the time, the interface transport mechanism IFR rotates the hand support base 24b while lifting the hand support base 24b in the +Z direction to allow the hand H8 holding the substrate W to enter the substrate platform PASS10. The substrate W is thus transferred onto the substrate platform PASS10. After this, the interface transport mechanism IFR retracts the hand H8 from the substrate platform PASS10. The transfer of the substrate W from the exposure device 14 to the substrate platform PASS10 is thus completed.

In this embodiment, the hand H7 and the hand H8 are aligned substantially horizontally, and therefore, a liquid that may drop from the hand H8 and a substrate W held thereon does not attach to the hand H7 and a substrate W held thereon.

This prevents the attachment of a liquid to the substrate W before the exposure processing, so as to prevent the contamination of the substrate W due to the attachment of particles and the like to the liquid more sufficiently. It is thus possible to prevent processing defects due to e.g. degradation in the resolution performance of the exposure device 14.

In addition, the alignment of the hand H7 and the hand H8 in a substantially horizontal direction allows the hand H7 and the hand H8 to concurrently transfer the substrates W. This results in a reduced time for processing the substrates W, and therefore improved throughput.

Note that the movable base 21 described in the first embodiment may be used instead of the securing base 21K in FIG. 6 in this embodiment. Moreover, although the hand support bases 24a, 24b are both mounted on the common securing base 21K in this embodiment, the support bases 24a, 24b may be mounted separately on two securing bases 21K, respectively.

In the aforementioned first and second embodiment, the anti-reflection film processing block 10, the resist film processing block 11, and the development processing block 12 correspond to a processing section; the interface block 13 corresponds to an interface; and the fourth central robot CR4 and the interface transport mechanism IFR correspond to a transport device.

The hands H5, H7 correspond to a first holder; the hands H6, H8 correspond to a second holder; the edge exposure units EEW, the coating units BARC, RES, the development processing units DEV, the thermal processing units PHP, the hot plates HP, the adhesion agent coating processing units AHL, and the cooling plates CP correspond to a processing unit; the substrate platforms PASS9, PASS10 correspond to a platform; the fourth central robot CR4 corresponds to a first transport unit; and the interface transport mechanism IFR corresponds to a second transport unit.

The hand CRH7 corresponds to a third holder; the hand CRH8 corresponds to a fourth holder; the substrate platform PASS9 corresponds to a first platform unit; and the substrate platform PASS10 corresponds to a second platform unit.

The thermal processing groups 100, 101 for anti-reflection film, the thermal processing groups 110, 111 for resist film, the thermal processing groups 120, 121 for development, the hot plates HP, and the cooling plates CP correspond to a thermal processing unit; and the coating units BARC in the coating processing group 70 for anti-reflection film corresponds to an anti-reflection film formation unit. The coating units RES in the coating processing group 80 for resist film corresponds to a photosensitive film formation unit; and the development processing units DEV in the development processing group 90 corresponds to a development unit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A substrate processing apparatus that is arranged adjacent to a liquid immersion exposure device that performs exposure processing by a liquid immersion method, comprising:

a processing section for applying processing to a substrate; and an interface for exchanging the substrate between said processing section and said exposure device, wherein said interface includes a transport device that transports the substrate between said processing section and said exposure device, and said transport device includes a first holder for holding the substrate to which no liquid is attached before the exposure processing by said liquid immersion exposure device, and a second holder for holding the substrate to which a liquid is attached after the exposure processing by said liquid immersion exposure device; wherein said first and second holders are provided one above the other, and said second holder is provided below said first holder.

2. The substrate processing apparatus according to claim 1, wherein said processing section includes a thermal processing unit that subjects the substrate to given thermal treatment.

3. The substrate processing apparatus according to claim 1, wherein said processing section includes a photosensitive film formation unit that forms a photosensitive film made of a photosensitive material on the substrate.

4. The substrate processing apparatus according to claim 3, wherein said processing section further includes an anti-reflection film formation unit that forms an anti-reflection film on the substrate before the formation of said photosensitive film by said photosensitive film formation unit.

5. The substrate processing apparatus according to claim 1, wherein said processing section includes a development processing unit that subjects the substrate to development processing.

6. A substrate processing apparatus that is arranged adjacent to a liquid immersion exposure device that performs exposure processing by a liquid immersion method, comprising:

a processing section for applying processing to a substrate; and an interface for exchanging the substrate between said processing section and said exposure device, wherein said interface includes a transport device that transports the substrate between said processing section and said exposure device, and said transport device includes a first holder for holding the substrate to which no liquid is attached before the exposure processing by said liquid immersion exposure device, and a second holder for holding the substrate to which a liquid is attached after the exposure processing by said liquid immersion exposure device; wherein said interface further includes a processing unit that applies given processing to the substrate and a platform on which the substrate is temporarily mounted, and said transport device includes:

a first transport unit that transports the substrate between said processing section, said processing unit, and said platform; and a second transport unit that transports the substrate between said exposure device and said platform, and wherein said second transport unit has said first and second holders; wherein said first transport unit has a third holder for holding the substrate before the exposure processing by said exposure device and a fourth holder for holding the substrate after the exposure processing by said exposure device.

7. The substrate processing apparatus according to claim 6, wherein said platform includes a first platform unit on which the substrate before the exposure processing by said exposure device is mounted, and a second platform unit on which the substrate after the exposure processing by said exposure device is mounted.

8. The substrate processing apparatus according to claim 6, wherein said processing unit includes an edge exposure unit that subjects a peripheral portion of the substrate to exposure.

9. The substrate processing apparatus according to claim 6, wherein said first and second holders are provided one above the other, and said second holder is provided below said first holder.

10. The substrate processing apparatus according to claim 6, wherein said first and second holders are aligned in a substantially horizontal direction.

* * * * *

UNITED STATES PATENT AND TRADEMARK OFFICE
CERTIFICATE OF CORRECTION

PATENT NO.      : 7,658,560 B2                                               Page 1 of 1
APPLICATION NO. : 11/273441
DATED           : February 9, 2010
INVENTOR(S)     : Koji Kaneyama It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1086 days.

Signed and Sealed this

Thirtieth Day of November, 2010

David J. Kappos
*Director of the United States Patent and Trademark Office*